United States Patent
Kajita et al.

(10) Patent No.: US 6,420,224 B2
(45) Date of Patent: Jul. 16, 2002

(54) STEPPER ALIGNMENT MARK FORMATION WITH DUAL FIELD OXIDE PROCESS

(75) Inventors: Tatsuya Kajita, Cupertino; Mark S. Chang, Los Altos, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/836,064

(22) Filed: Apr. 16, 2001

Related U.S. Application Data

(62) Division of application No. 09/044,389, filed on Mar. 18, 1998, now Pat. No. 6,249,036.

(51) Int. Cl.$^7$ .......................................... H01L 21/8238
(52) U.S. Cl. ........................ 438/225; 438/297; 438/362
(58) Field of Search .................................. 257/509, 647, 257/648; 438/225, 297, 362, 448, 452

(56) References Cited

U.S. PATENT DOCUMENTS

| | | | |
|---|---|---|---|
| 4,893,163 A | * 1/1990 | Rudeck | 257/797 |
| 5,128,274 A | * 7/1992 | Yabu et al. | 438/452 |
| 5,966,618 A | * 10/1999 | Sun et al. | 438/452 |

FOREIGN PATENT DOCUMENTS

| | | | |
|---|---|---|---|
| JP | 360063921 A | * | 4/1985 |
| JP | 3049212 A | * | 3/1991 |

OTHER PUBLICATIONS

Wolf et al., "Silicon Processing for the VLSI Era," 1986, pp. 471–476.*

* cited by examiner

*Primary Examiner*—Olik Chaudhuri
*Assistant Examiner*—Hoai Pham
(74) *Attorney, Agent, or Firm*—LaRiviere, Grubman & Payne, LLP

(57) ABSTRACT

A semiconductor photomask set for producing wafer alignment accuracy in a semiconductor fabrication process. The photomask set produces an alignment mark that is accurate for subsequent fabrication after undergoing a dual field oxide (FOX) fabrication process. Prior arts methods have traditionally covered the alignment marks with layers of oxide material. The method includes the steps of: (a) providing a first photomask member having mask portions for forming a plurality of first field oxide regions on a first region of a semiconductor substrate and also having a mask portion for forming an alignment marker; (b) providing a second photomask member having mask portions for forming a plurality of second field oxide regions on a second region of the semiconductor substrate and also having mask portions delineated for covering any first field oxide regions and alignment marker formed by using the first photomask member; (c) forming the first field oxide regions and the alignment marker utilizing the first photomask member; (d) covering the formed first field oxide regions and the alignment marker with a photoresist material by utilizing the second photomask member; (e) forming the second field oxide regions after utilizing the second photomask member; (f) facilitating wafer alignment accuracy by removing the photoresist material and exposing the alignment marker; and (g) aligning a semiconductor wafer by utilizing the exposed alignment marker. The mask set can be used in conjunction with stepper wafer alignment tools and is especially useful in forming a memory semiconductor product capable of performing block data erasure operations. The exposed alignment marker facilitates checking and testing mask misalignment during the fabrication process.

5 Claims, 5 Drawing Sheets

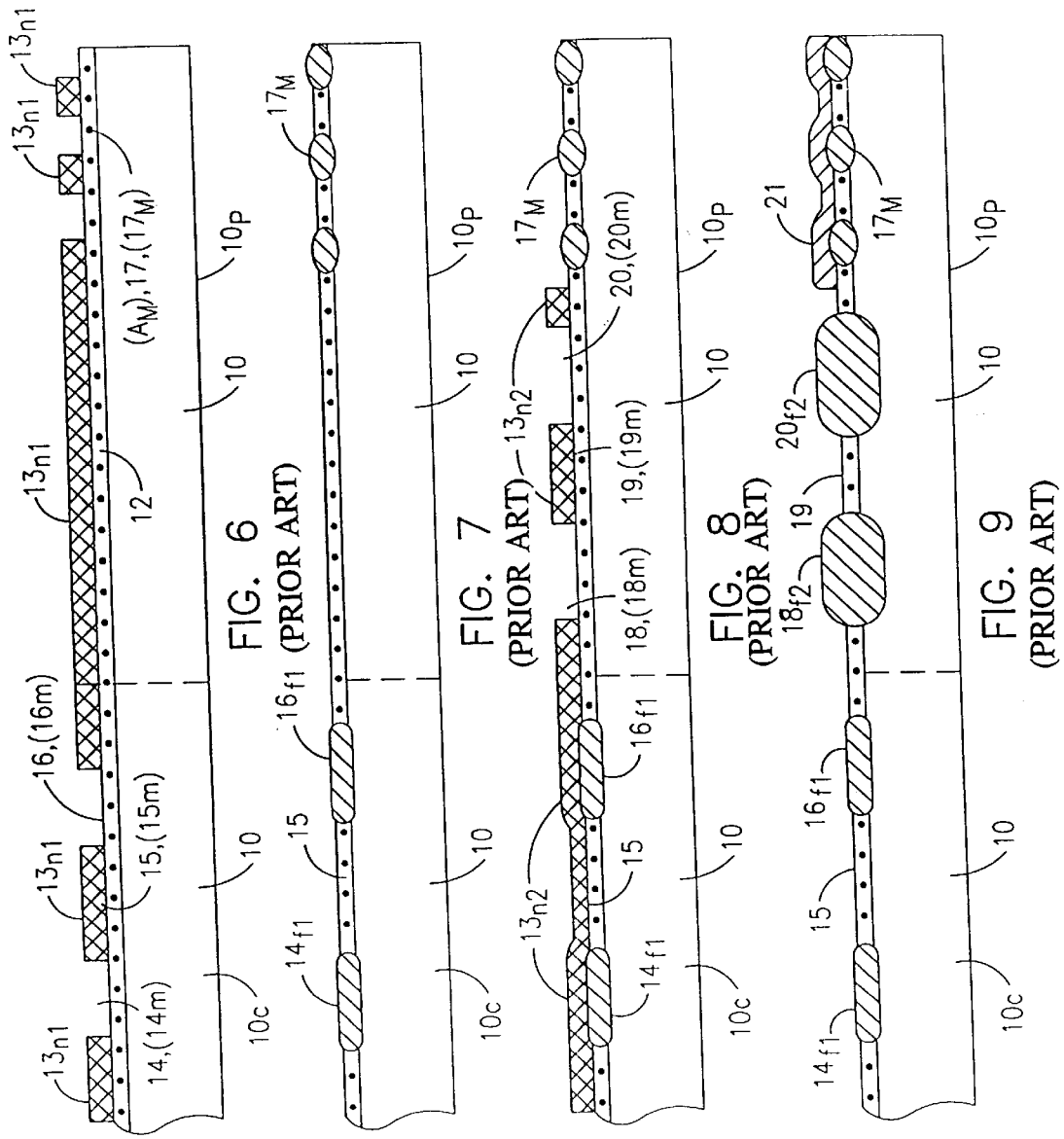

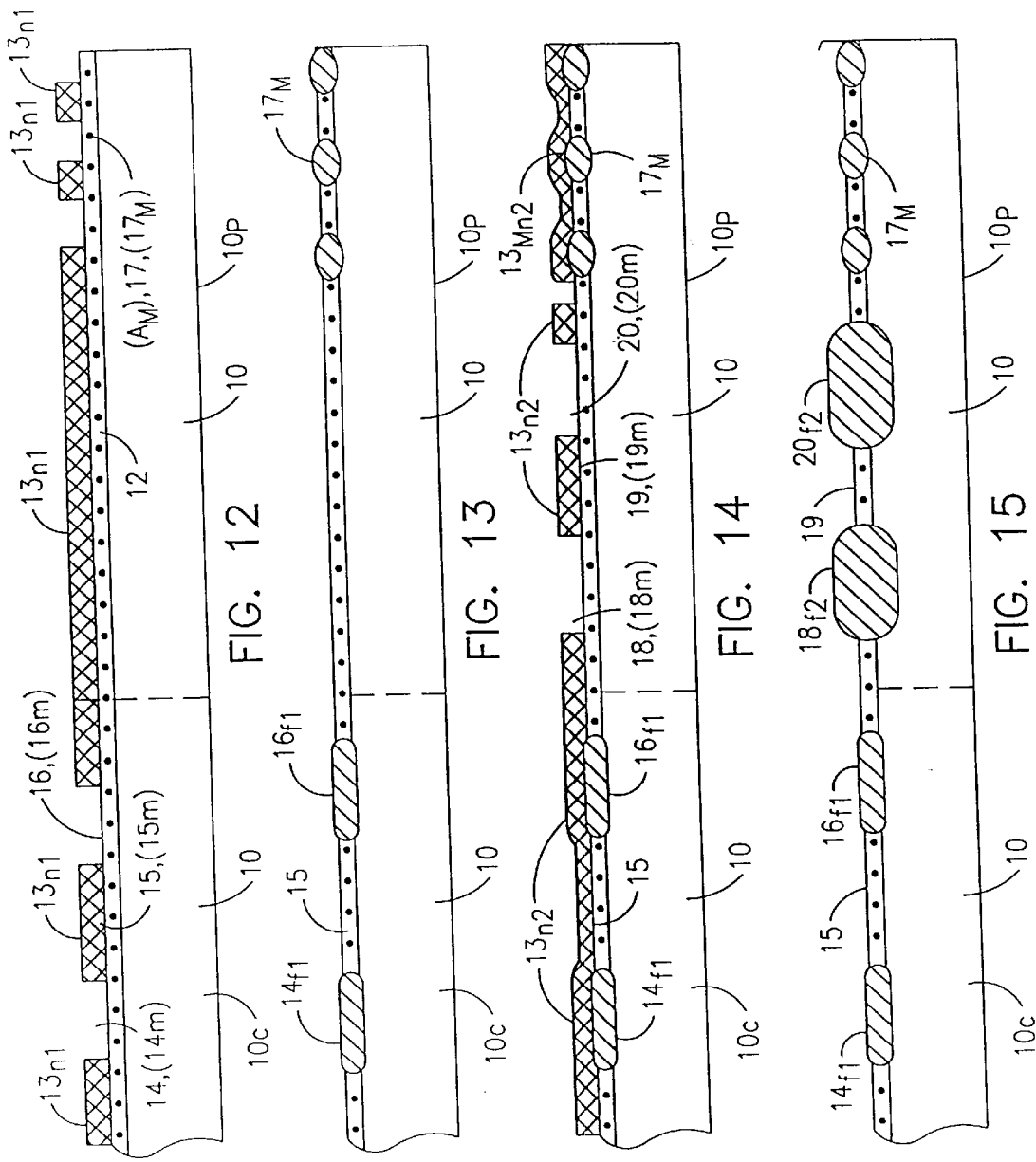

STEPPER ALIGNMENT MARK FORMATION WITH DUAL FIELD OXIDE PROCESS

RELATED APPLICATION(S)

This application is a divisional patent application of, and claiming priority from, U.S. patent application Ser. No. 09/044,389, entitled "STEPPER ALIGNMENT MARK FORMATION WITH DUAL FIELD OXIDE PROCESS," filed Mar. 18, 1998, issued on Jun. 19, 2001, as U.S. Pat. No. 6,249,036 B1, by the same applicants.

TECHNICAL FIELD

The present invention relates to integrated circuits and fabrication techniques for forming field oxide (FOX) regions on the integrated circuit substrate. More particularly, the present invention relates to fabrication techniques for improving the visibility of alignment marks used in forming dual field oxide regions on the integrated circuit substrate.

BACKGROUND OF THE INVENTION

Silicon dioxide (oxide) is a dielectric material widely used in the fabrication of integrated semiconductor circuits. The oxide thickness determines whether the oxide prevents shorting (insulator), or induction of electrical charges on the wafer surface. When used to prevent electrical charge induction from the metal layers, the oxide is referred to as a field oxide (FOX) layer. The magnitude of the voltages in the integrated circuit impacts the thickness of the FOX regions. By example, in fabricating a memory product, the core of the die is used to fabricate memory circuit elements, while the periphery is used for logic circuitry. Memory circuits operate at, or below, the 5.0 VDC range, while other circuitry, such as logic circuitry, operates in the 10 VDC to 20 VDC range. The higher voltages utilized in the periphery requires a thicker FOX than the FOX used in the core of the die (4000 Å compared to 2000 Å). In order to fabricate the die with the two thicknesses of FOX in the core and periphery areas of the die, a dual FOX layering process must be employed.

As is known in the prior art, masks are provided with an alignment mark for use in aligning the various patterns on the wafer. A first mask creates a target on the wafer at a first patterning step. Subsequent masks contain masks portions which align to the previously formed mask. In dual field oxide fabrication processes, the second masking operation has traditionally caused a second layer of oxide material to be fabricated over the previously fabricated alignment marker. The subsequent alignment after the dual field oxide process has caused misalignment problems and device failures. Any attempts to test for mask misalignment is frustrated because of the second layer of oxide material that has been fabricated over the previously fabricated alignment marker. Thus, a need is seen to exist for a fabrication process involving dual field oxide fabrication where the alignment marker is not diminished by the second field oxide layer and that facilitates checking for mask misalignment during subsequent masking operations.

Accordingly, a primary object of the present invention is to provide a [photomask] mask set that produces an alignment mark that is accurate for subsequent fabrication process after undergoing a dual field oxide (FOX) fabrication process.

BRIEF SUMMARY OF THE INVENTION

Accordingly, the foregoing object is accomplished by providing a semiconductor mask set for producing wafer alignment accuracy in a semiconductor fabrication process. The mask set produces an alignment mark that is accurate for subsequent fabrication after undergoing a dual field oxide (FOX) fabrication process. Prior art methods have traditionally covered the alignment marks with layers of oxide material. The present method includes the steps of: (a) providing a first mask member having mask portions for forming a plurality of first field oxide regions on a first region of a semiconductor substrate and also having a mask portion for forming an alignment marker; (b) providing a second mask member having mask portions for forming a plurality of second field oxide regions on a second region of the semiconductor substrate and also having mask portions delineated for covering any first field oxide regions and alignment marker formed by using the first mask member; (c) forming the first field oxide regions and the alignment marker utilizing the first mask member; (d) covering the formed first field oxide regions and the alignment marker with a photoresist material by utilizing the second mask member; (e) forming the second field oxide regions after utilizing the second mask member; (f) facilitating wafer alignment accuracy by removing the photoresist material and exposing the alignment marker; and (g) aligning a semiconductor wafer by utilizing the exposed alignment marker. The mask set can be used in conjunction with stepper wafer alignment tools and is especially useful in forming a memory semiconductor product capable of performing block data erasure operations. Additionally, the exposed alignment marker resulting after the second field oxide facilitates testing for mask misalignment during subsequent masking operations.

Other features of the present invention are disclosed or apparent in the section entitled: "DETAILED DESCRIPTION OF THE INVENTION."

BRIEF DESCRIPTION OF DRAWINGS

For fuller understanding of the present invention, reference is made to the accompanying drawing in the following section entitled: "DETAILED DESCRIPTION OF THE INVENTION." In the drawings:

FIG. 6 is a cross-section of an integrated circuit substrate showing a nitride layer deposited on the core region and peripheral region after utilizing the mask of FIG. 4, in accordance with the related art;

FIG. 7 is a cross-section of the semiconductor substrate illustrated in FIG. 6 after etching the nitride layer and growing field oxide pads and a first alignment mark, in accordance with the related art;

FIG. 8 is a cross-section view of the semiconductor substrate illustrated in FIG. 7 showing a second nitride layer grown in the peripheral region utilizing the mask depicted in FIG. 5, in accordance with the related art;

FIG. 9 is a cross-section view of the semiconductor substrate illustrated in FIG. 8 shown after growing the second field oxide pads in the peripheral region and etching the nitride layers over the first field oxide pads, and particularly showing the second field oxide covering the first alignment mark, in accordance with the related art;

FIGS. 12 and 13 are identical to FIGS. 6 and 7 and are used in accordance with the present invention;

FIG. 14 is a cross-section view of the semiconductor substrate illustrated in FIG. 13 showing a second nitride layer grown in the peripheral region utilizing the mask depicted in FIG. 10, and particularly showing the first alignment mark being protected by a nitride layer; and FIG. 15 is a cross-section view of the semiconductor substrate illustrated in FIG. 14 shown after growing the second field oxide pads in the peripheral region and etching the nitride layer over the field oxide pads in the core region and the first alignment mark.

Figure 1:
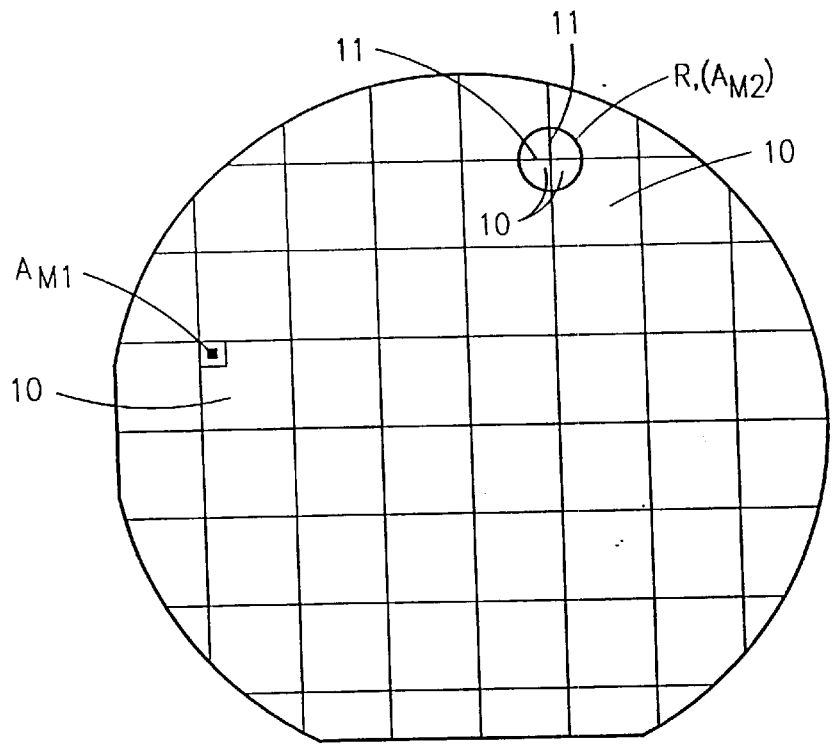
FIG. 1 is a top view of a semiconductor wafer illustrating two ways of placement of an alignment mark, in accordance with the related art.

Reference numbers refer to the same or equivalent parts of the present invention throughout the several figures of the drawing.

DETAILED DESCRIPTION OF THE INVENTION

Referring now to the drawings where FIGS. 1–9 basically illustrate the prior art apparatus and fabrication steps for forming isolation regions in a dual FOX process which result in producing inferior alignment markers.

Figure 2:
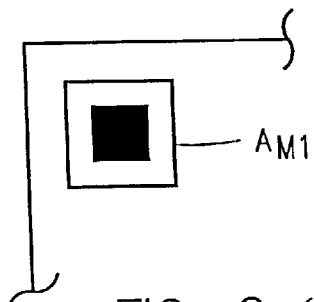
FIG. 2 is a partial top view of one of the alignment marks depicted in FIG. 1, in accordance with the related art.
Figure 3:
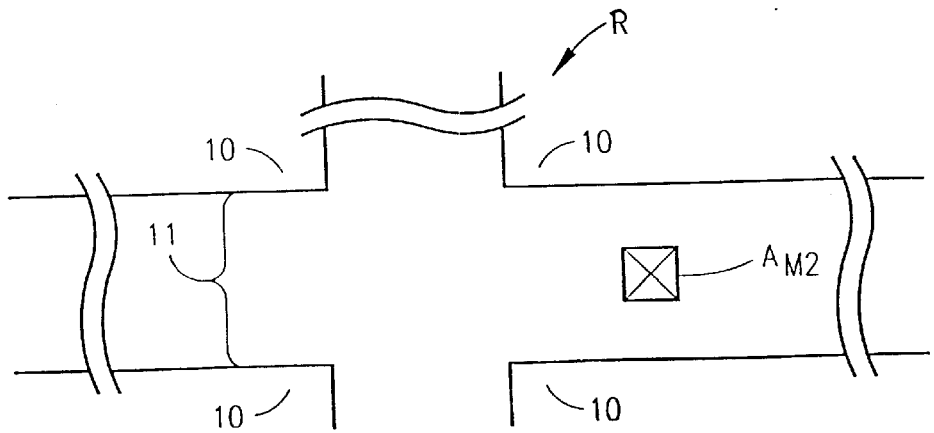
FIG. 3 is a partial top view of the other alignment mark depicted in FIG. 1, illustrating the scribe line marks used to delineate the individual integrated circuit chips, in accordance with the related art.
Figure 4:
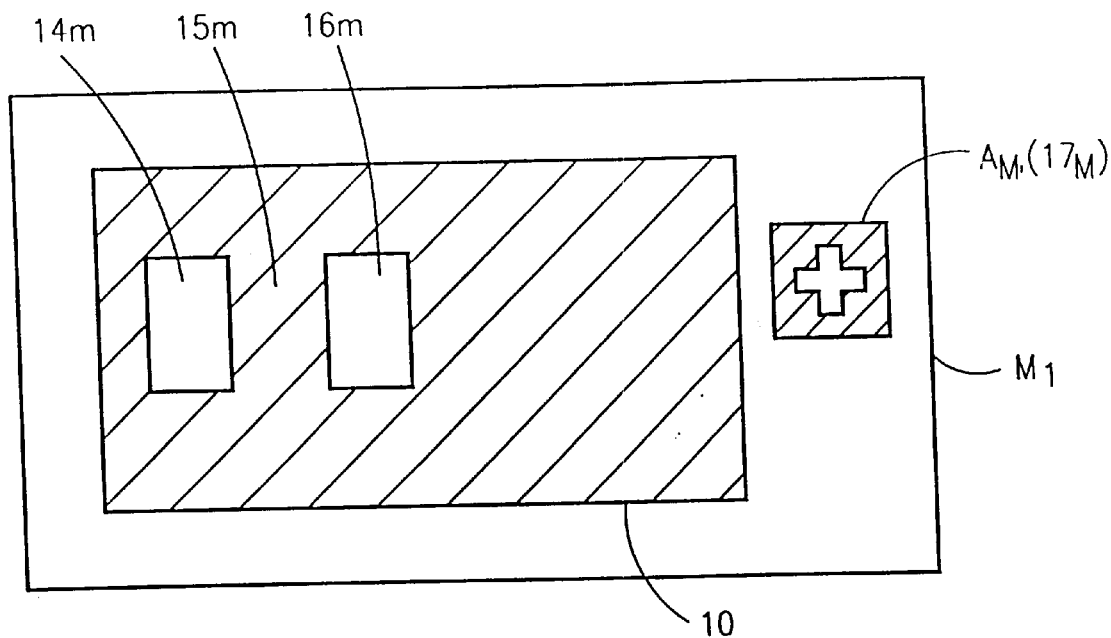
FIG. 4 is a top view of a mask containing an alignment mark for patterning a device region on a core region of the semiconductor chip, in accordance with the related art.
Figure 5:
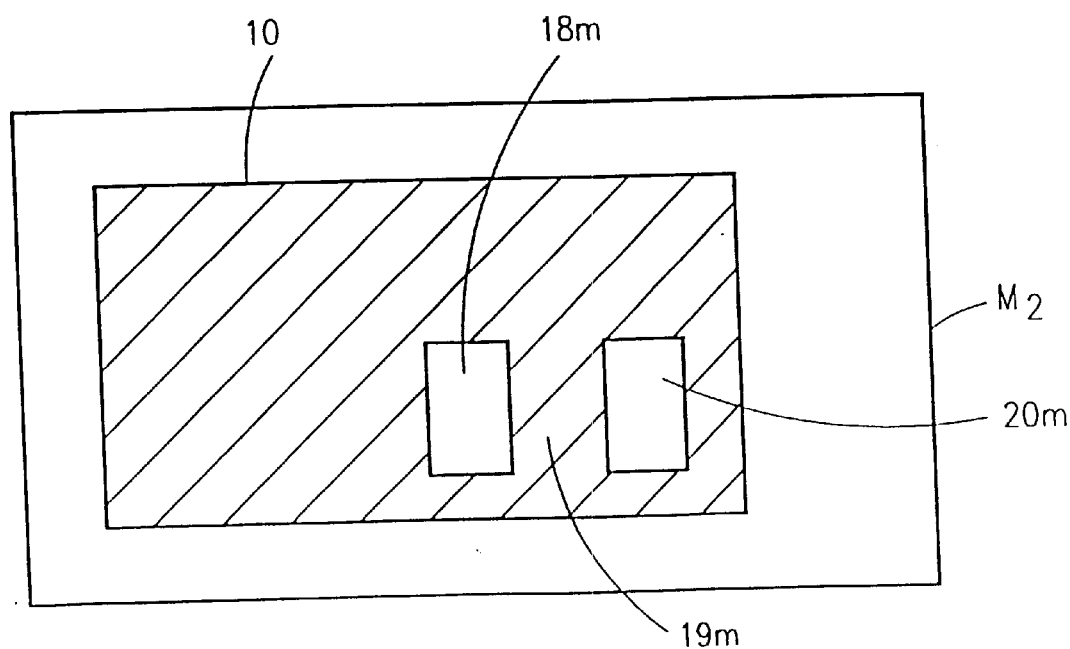
FIG. 5 is a top view of a mask containing the same alignment mark for patterning a device region on a peripheral region of the semiconductor chip, in accordance with the related art.

Referring now to FIG. 1 which shows a top view of a semiconductor wafer illustrating two ways of placement of an alignment marks $A_{M1}$ and $A_{M2}$ in a wafer region R. The wafer comprises a plurality of dies 10 and are delineated on the wafer at scribe lines 11. FIG. 2 is a partial top view of alignment mark $A_{M1}$ depicted in FIG. 1 and FIG. 3 is a partial enlarged top view of wafer region R and the other alignment mark $A_{M2}$ disposed in the space delineating the scribe line 11, also depicted in FIG. 1. FIG. 3 illustrates the actual mark in dark regions that would be fabricated on the dies, and in particular, illustrates the scribe line 11 used to separate the individual integrated circuit chips 10. FIG. 4 is a top view of an exemplary mask $M_1$ containing an alignment mark portion $A_M$ for patterning an alignment marker $17_M$ and mask portions 14m, 15m, and 16m for patterning oxide and active regions 14, 15, and 16 on the core device region 10c of the semiconductor chip 10, see generally FIGS. 6 and 7. FIG. 5 similarly shows a top view of an exemplary mask $M_2$ containing masking portions 18m, 19m, and 20m for patterning oxide and active regions 18, 19 and 20 on the peripheral device region 10p of the semiconductor chip 10, see generally FIGS. 8 and 9. Prior art mask $M_2$ allows a layer of oxide 21 to cover alignment marker $17_M$ to be covered as seen from FIG. 9. In a stepper alignment the stepper itself has target region to align to a previously formed alignment marker formed by the first masking process.

FIG. 6 shows in cross-section integrated circuit substrate 10 having a layer of barrier oxide 12, core region 10c and peripheral region 10p fabricated after utilizing the mask $M_1$ of FIG. 4. The patterning step preceding FIG. 6 essentially mask regions 14, 16 and marker region 17 (reference mask portion $A_M$), using photoresist commonly used in the industry, while facilitating the growing of silicon nitride portions $13_{n1}$, where oxide is not to be grown, by example region 15 which will be an active region on the substrate. FIG. 7 is a cross-section of the semiconductor substrate illustrated in FIG. 6 after growing first field oxide pads $14_{f1}$, $16_{f1}$ and a first alignment mark $17_M$ after etching the nitride layer $13_{n1}$ and exposing active region 15. The first field oxide pads $14_{f1}$, $16_{f1}$, comprise, by example, silicon dioxide material having a thickness of 2000 Å.

The next phase as depicted in FIGS. 8 and 9 comprises growing the second and thicker field oxide pads in a dual FOX process and the use of second mask $M_2$ of FIG. 5. The patterning step preceding FIG. 8 essentially mask regions 18, and 20 while targeting on alignment marker $17_M$. As before, the process comprises using a photoresist commonly used in the industry to mask regions, by example active region 15, 19 and first oxide pads $14_{f1}$, $16_{f1}$, but not regions 18 and 20 on chip 10, while facilitating the growing of silicon nitride portions $13_{n2}$, where oxide is not to be grown. As seen in FIG. 8, the alignment marker $17_M$ is not protected by silicon nitride layer $13_{n2}$.

FIG. 9 is a cross-section view of the semiconductor substrate 10 illustrated in FIG. 8 after growing second field oxide pads $18_{f2}$, $20_{f2}$ and an additional coat of oxide 21 over alignment mark $17_M$. After the second oxide pads are grown nitride layer $13_{n2}$ is etched to expose active regions 15 and 19 and the first oxide pads $14_{f1}$, $16_{f1}$. The second field oxide pads $18_{f2}$, $20_{f2}$ comprise, by example, silicon dioxide material having a thickness of 4000 Å. The oxide coating 21 over the alignment marker $17_M$ prevents any subsequent use of the alignment marker $17_M$ to check for misalignment of subsequent masks used during the fabrication process after the second field oxide pads $18_{f2}$, $20_{f2}$ are formed.

Figure 10:
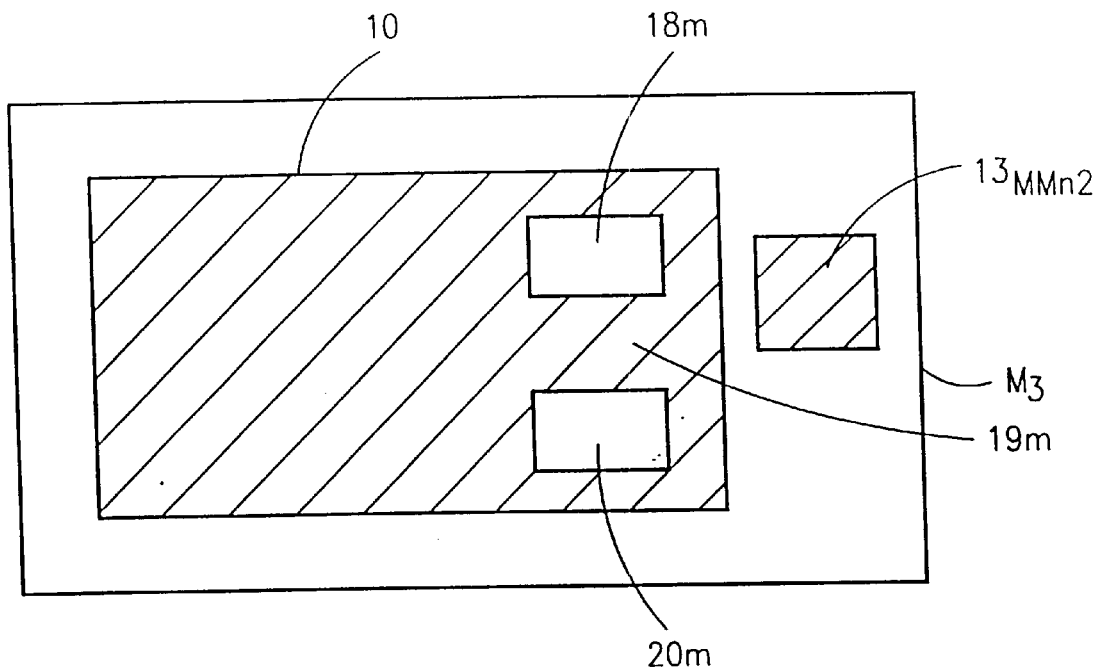
FIG. 10 is a mask, in accordance with the present invention for growing a nitride layer over the first alignment mark.
Figure 11:
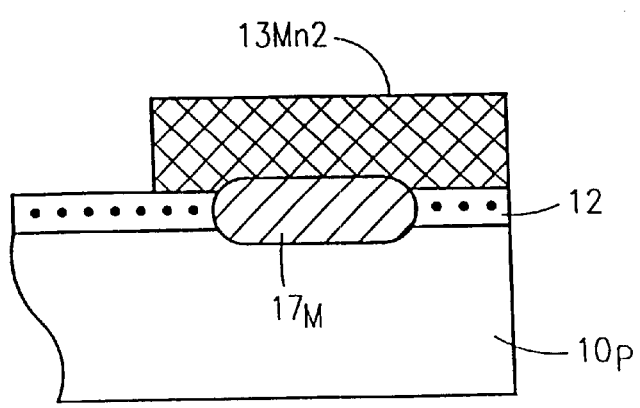
FIG. 11 is a partial cross-section view of the first alignment mark of FIG. 10 being protected by the nitride layer.

FIG. 10 is a mask $M_3$, having mask portion $13_{MMn2}$, in accordance with the present invention, for growing a nitride layer $13_{Mn2}$ over the first alignment marker $17_M$, as depicted in FIG. 11. Basically, mask $M_3$ replaces mask $M_2$ in the dual FOX fabrication process, and accordingly, FIGS. 12 and 13 are identical to FIGS. 6 and 7 and whose description is repeated for convenience with change in Fig. numeral reference. Thus, FIG. 12 shows in cross-section integrated circuit substrate 10 having a layer of barrier oxide 12, core region 10c and peripheral region 10p fabricated after utilizing the mask $M_1$ of FIG. 4. The patterning step preceding FIG. 12 essentially mask regions 14, 16 and marker region 17 (reference mask portion $A_M$), using photoresist commonly used in the industry, while facilitating the growing of silicon nitride portions $13_{n1}$, where oxide is not to be grown, by example region 15 which will be an active region on the substrate. FIG. 13 is a cross-section of the semiconductor substrate illustrated in FIG. 12 after growing first field oxide pads $14_{f1}$, $16_{f1}$, and a first alignment mark $17_M$ after etching the nitride layer $13_{n1}$, and exposing active region 15. The first field oxide pads $14_{f1}$, $16_{f1}$, comprise, by example, silicon dioxide material having a thickness of 2000 Å.

FIGS. 14 and 15 differ from FIGS. 8 and 9 with respect to the present invention of protecting the initially formed alignment marker $17_M$ and the fabrication benefits associated with being able to use the alignment marker. Accordingly, the next phase of the present invention, as depicted in FIGS. 14 and 15, comprises growing the second and thicker field oxide pads in a dual FOX process and the use of mask $M_3$ of FIG. 10. The patterning step preceding FIG. 14 now masks alignment mark $17_M$ which was not masked using prior art process steps as shown in FIG. 8. As before, the process comprises using a photoresist commonly used in the industry to mask regions, by example active region 15, 19 and first oxide pads $14_{f1}$, $16_{f1}$, except regions 18 and 20, but differs in that during the growing of silicon nitride portions $13_{n2}$, the alignment marker $17_M$ is now included in those other regions where oxide is not to be grown. As seen in FIG. 14, the alignment marker $17_M$ is now protected by silicon nitride layer $13_{Mn2}$.

FIG. 15 is a cross-section view of the semiconductor substrate 10 illustrated in FIG. 14 after growing second field oxide pads $18_{f2}$, $20_{f2}$ without an additional coat of oxide over alignment mark $17_M$. After the second oxide pads $18_{f2}$, $20_{f2}$ are grown, nitride layer $13_{n2}$ and $13_{Mn2}$ are etched to expose active regions 15 and 19, the first oxide pads $14_{f1}$, $16_{f1}$, and now alignment marker $17_M$. The second field oxide pads $18_{f2}$, $20_{f2}$ comprise, by example, silicon dioxide material having a thickness of 4000 Å. Having alignment marker $17_M$ exposed after the formation of the second field oxide pads $18_{f2}$, $20_{f2}$ allows testing and checking for misalignment of subsequent masks that are required to complete the fabrication of the semiconductor device.

The present invention has been particularly shown and described with respect to a certain preferred embodiment and features thereof. However, it should be readily apparent to those of ordinary skill in the art that various changes and modifications in form, semiconductor material, material conductivity type (i.e., N-type, or P-type), and detail may be made without departing from the spirit and scope of the inventions as set forth in the appended claims. The inventions illustratively disclosed herein may be practiced without any element which is not specifically disclosed herein.

What is claimed:

1. A method for preserving alignment marker integrity in fabricating a semiconductor device, comprising the steps of:
   (a) forming a first mask member disposed on a semiconductor substrate, said step (a) comprising:
      (1) forming a primary first mask member portion for patterning at least one first field oxide region, and
      (2) forming a secondary first mask member portion for patterning at least one alignment marker region,
      whereby said primary first mask member portion facilitates formation of said at least one first field oxide region on a core region of a semiconductor substrate, and
      whereby said secondary first mask member portion facilitates formation of said at least one alignment marker; and
   (b) forming a second mask member disposed on a semiconductor substrate, said step (b) comprising:
      (1) forming a corresponding primary second mask member portion for patterning at least one second field oxide region, and
      (2) forming a corresponding secondary second mask member portion for covering and preserving said at least one formed alignment marker,
      whereby said corresponding primary second mask member portion facilitates formation of said at least one second field oxide region on a peripheral region of a semiconductor substrate,
      whereby said corresponding secondary second mask member portion covers and preserves said at least one formed alignment marker during formation of said at least one second field oxide region, and
      whereby said first mask member and said second mask member comprise a dual mask set apparatus.

2. A method, as recited in claim 1, wherein said step (b) comprises utilizing said dual mask set apparatus in conjunction with a stepper marker alignment technique.

3. A method, as recited in claim 2, wherein said step (a) comprises:
   forming said at least one core field oxide pad, comprising said at least one first field oxide region, to a first thickness using said first mask member; and
   forming said at least one alignment marker to said first thickness using said first mask member, and
wherein said step (b) comprises:
   forming said at least one field oxide pad, comprising said at least one second field oxide region, to a second thickness distinct from said first thickness, while covering and preserving said at least one alignment marker using said second mask member.

4. A method, as recited in claim 1,
wherein said step (a) comprises:
   forming said at least one core field oxide pad, comprising said at least one first field oxide region, to a first thickness using said first mask member; and
   forming said at least one alignment marker to said first thickness using said first mask member, and
wherein said step (b) comprises:
   forming said at least one field oxide pad, comprising said at least one second field oxide region, to a second thickness distinct from said first thickness, while covering and preserving said at least one alignment marker using said second mask member.

5. A method for preserving alignment marker integrity in fabricating a semiconductor device, comprising the steps of:
   (a) forming a first mask member disposed on a semiconductor substrate, said step (a) comprising:
      (1) forming a primary first mask member portion for patterning at least one first field oxide region, and
      (2) forming a secondary first mask member portion for patterning at least one alignment marker region,
      whereby said primary first mask member portion facilitates formation of said at least one first field oxide region on a core region of a semiconductor substrate, and
      whereby said secondary first mask member portion facilitates formation of said at least one alignment marker; and
   (b) forming a second mask member disposed on a semiconductor substrate, said step (b) comprising:
      (1) forming a corresponding primary second mask member portion for patterning at least one second field oxide region, and
      (2) forming a corresponding secondary second mask member portion for covering and preserving said at least one formed alignment marker,
      whereby said corresponding primary second mask member portion facilitates formation of said at least one second field oxide region on a peripheral region of a semiconductor substrate,
      whereby said corresponding secondary second mask member portion covers and preserves said at least one formed alignment marker during formation of said at least one second field oxide region, and
      whereby said first mask member and said second mask member comprise a dual mask set apparatus,
   wherein said step (b) comprises utilizing said dual mask set apparatus in conjunction with a stepper marker alignment technique,
   wherein said step (a) comprises:
      forming said at least one core field oxide pad, comprising said at least one first field oxide region, to a first thickness using said first mask member; and
      forming said at least one alignment marker to said first thickness using said first mask member, and
   wherein said step (b) comprises:
      forming said at least one field oxide pad, comprising said at least one second field oxide region, to a second thickness distinct from said first thickness, while covering and preserving said at least one alignment marker using said second mask member.

* * * * *

UNITED STATES PATENT AND TRADEMARK OFFICE
CERTIFICATE OF CORRECTION

PATENT NO. : 6,420,224 B2  Page 1 of 1
DATED : July 16, 2002
INVENTOR(S) : Tatsuya Kajita and Mark S. Chang It is certified that error appears in the above-identified patent and that said Letters Patent is hereby corrected as shown below:

<u>Title page,</u>
Item [73], Assignee, add: -- Fujitsu Limited, Japan --.

Signed and Sealed this

Thirtieth Day of September, 2003

JAMES E. ROGAN
*Director of the United States Patent and Trademark Office*